United States Patent
Tsai

(10) Patent No.: US 6,281,694 B1
(45) Date of Patent: Aug. 28, 2001

(54) MONITOR METHOD FOR TESTING PROBE PINS

(75) Inventor: Meng-Jin Tsai, Kaohsiung (TW)

(73) Assignee: United Microelectronics Corp., Hsinchu (TW)

( * ) Notice: Subject to any disclaimer, the term of this patent is extended or adjusted under 35 U.S.C. 154(b) by 0 days.

(21) Appl. No.: 09/449,662

(22) Filed: Nov. 30, 1999

(51) Int. Cl.⁷ .................................................. G01R 31/02
(52) U.S. Cl. ........................ 324/758; 324/158.1; 439/482
(58) Field of Search ................................ 324/158.1, 758, 324/754, 64, 762, 760, 761, 765; 361/88; 73/105, 12; 439/482

(56) References Cited

U.S. PATENT DOCUMENTS

| | | | |
|---|---|---|---|
| 3,783,375 | * 1/1974 | Bennett | 324/64 |
| 4,379,401 | * 4/1983 | San Miguel | 73/12 |
| 4,864,227 | * 9/1989 | Sato | 324/158.1 |
| 5,585,736 | * 12/1996 | Hshieh et al. | 324/754 |
| 5,691,467 | * 11/1997 | Goldmann et al. | 73/105 |
| 5,818,249 | * 10/1998 | Momohara | 324/762 |
| 5,844,421 | * 12/1998 | Lee at al. | 324/758 |
| 5,902,504 | * 5/1999 | Merchant et al. | 29/497 |
| 5,933,309 | * 8/1999 | Smith | 361/88 |

* cited by examiner

Primary Examiner—Safet Metjahic
Assistant Examiner—Jimmy Nguyen
(74) Attorney, Agent, or Firm—Thomas, Kayden, Horstemeyer & Risley, LLP

(57) ABSTRACT

A monitor method for testing probe pins is described in this invention. In accordance with the method of the present invention, a particular probe pin with short, deformity or unstable contact is identified.

12 Claims, 2 Drawing Sheets

MONITOR METHOD FOR TESTING PROBE PINS

BACKGROUND OF THE INVENTION

1. Field of Invention

The present invention relates to a testing method. More particularly, the present invention relates to a monitor method for testing probe pins used in a WAT (wafer acceptance test) process.

2. Description of Related Art

After completing manufacturing processes, dies on the wafer should be verified. Generally, a probe card with probe pins is used to test the dies. The probe pins on the probe card directly contact the wafer to perform the testing process. Since the probe pins directly contact the wafer, the probe pins are easily deformed. Moreover, some materials such as oxide, photoresist residues or solvent contamination are usually adhered on the probe pins due to the direct contact. Therefore, erroneous data may be obtained by using the problem probe pins.

FIG. 1 is a schematic diagram showing probe pins with various problems including a short, unstable contact and deformity.

Referring to FIG. 1, probe pins 12a, 12b, 12c, 12d, 12e are formed on a probe card 10. The probe pin 12a is normal. Material 14a is adhered on the probe pin 12b, and material 14b is adhered on the probe pins 12c, 12d. The materials 14a, 14b are, for example, oxide, photoresist residues or solvent contamination. Because of the material 14b, the probe pin 12c and 12d are shorted. The probe pin 12e is deformed; thus, the probe pin 12e cannot contact the wafer during the testing process.

Since the dimension of the probe pin is small, it is difficult to identify the above problems. Moreover, many probe pins are formed on a probe card; thus, it is difficult to identify a particular probe pin. Consequently, erroneous results are obtained during the testing process by using the problem probe pins.

SUMMARY OF THE INVENTION

The invention provides a monitor method for testing probe pins, which method is applied on a testing apparatus with a plurality of probe pins. In accordance with the method disclosed in the present invention, a particular probe pin suffering a short, deformity or unstable contact is identified.

The invention provides a monitor method for testing probe pins. By the method, a plurality of the probe pins are grouped and tested to identify the problem probe pin.

The invention provides a monitor method for testing probe pins to identify a probe pin suffering from a short.

The invention provides a monitor method for testing probe pins to identify a deformity or unstable contact of the probe pin.

As embodied and broadly described herein, the invention provides a monitor method for testing probe pins. The method includes the following steps. A plurality of probe pins is grouped, and a group includes several probe pins. The probe pins are floated. Then, a probe pin in a group is charged to measure the resistance thereof, and other probe pins in the same group are grounded. By checking the resistance of each probe pin, the short is identified. Next, a sample wafer with a thin film thereon is prepared, and the probe pins directly contact the sample wafer. The probe pins are charged to measure the contact resistance of each probe pin. In accordance with the contact resistance of each probe pin, the deformity or unstable contact is identified.

The invention also provides a monitor method for testing probe pins to identify a short. The method includes the following steps. A plurality of probe pins is grouped, and a group includes several probe pins. The probe pins are floated, and then charged to measure the resistance of each probe pin.

The invention furthermore provides a monitor method for testing probe pins to identify a deformity or unstable contact. The method includes the following steps. A plurality of probe pins is grouped, and a group includes several probe pins. A sample wafer with a thin film thereon is prepared. The probe pins contact the sample wafer, and then the probe pins are charged to measure the contact resistance of each probe pin.

In the present invention, a monitor method for testing probe pins is provided. With the present invention, a plurality of probe pins is grouped and tested simultaneously. Then, the particular problem probe pin suffering a short, deformity or unstable contact is identified.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention. In the drawings.

DESCRIPTION OF THE PREFERRED EMBODIMENTS

In this invention, a monitor method for testing probe pins is disclosed. Flow diagrams are shown herein to describe the testing process of the present invention.

Figure 1:
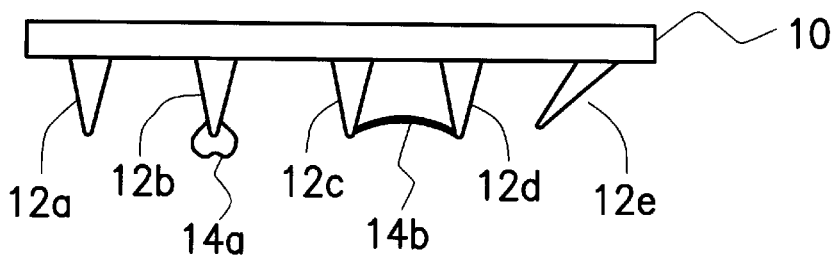
FIG. 1 is a schematic diagram showing probe pins with various problems including a short, unstable contact or deformity.
Figure 2:
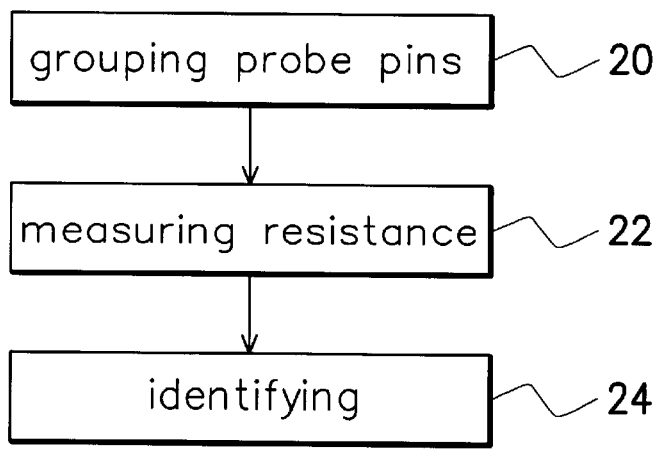
FIG. 2 is a flow diagram showing a methodology for identifying a short between the probe pins according to one preferred embodiment of this invention.

FIG. 2 is a flow diagram showing a methodology for identifying a short between the probe pins according to one preferred embodiment of this invention.

Referring to FIG. 2, probe pins are grouped before the testing process (step 20), and then each group is tested respectively to identify the problem probe pin therein.

In this embodiment, a probe card with 12 probe pins is used as an example, and 4 neighboring probe pins are grouped in one group. Therefore, there are nine groups in this embodiment, which are probe pins 1–4, probe pins 2–5, probe pins 3–6, probe pins 4–7, probe pins 5–8, probe pins 6–9, probe pins 8–11 and probe pins 9–12. The group setup described above is for explaining this embodiment. The implementation of the group setup is in accordance with the real case and is not limited by that described in this embodiment.

For identifying the problem probe pin, the resistance of each probe pin in a group should be measured. For example, while testing probe pins 1–4, each probe pin is floated. Then, probe pin 1 is charged to measure its resistance (step 22), and other probe pins, which are the probe pin 2, the probe pin 3 and the probe pin 4, are grounded. By performing the same method in sequence, the resistance of each probe pin is obtained. The problem probe pin in the group is identified by checking the resistance of each probe pin (step 24). The identification methodology is as follows. Since the probe pins are floated, each probe pin is in an "open" state; thus, the resistance of each probe pin is high. For example, in a condition where the resistances of probe pin 3 and probe pin 4 are both low, and the resistances of probe pin 1 and probe pin 2 are both high, it is ensured that a short or a leakage will occur at the probe pin 3 and the probe pin 4.

Figure 3:
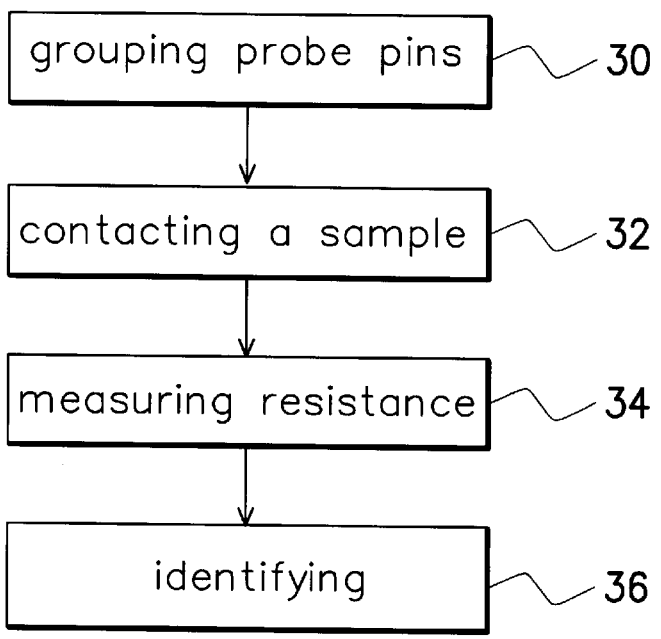
FIG. 3 is a flow diagram showing a methodology for identifying a deformity or unstable contact of the probe pins according to another preferred embodiment of this invention.

Next, a methodology for identifying a deformity or unstable contact of the probe pins is disclosed. FIG. 3 is a flow diagram showing a methodology for identifying a deformity or unstable contact of the probe pins according to another preferred embodiment of this invention.

Referring to FIG. 3, probe pins are grouped (step 30). The group setup used for explaining FIG. 2 is applied in this embodiment. The group setup is in accordance with the real case and is not limited by the embodiment.

A sample wafer with a thin film thereon is prepared, and then the probe pins directly contact the sample wafer (step 32). The material of the thin film is preferably a low resistance material such as aluminum or copper. By using these materials, a slight difference between the contact resistance of each probe pin can be easily identified.

For example, in a group including the probe pins 1–4, each probe pin is charged to measure the contact resistance thereof (step 34). By checking the contact resistance of each probe pin in the group, the problem probe pin therein is identified (step 36).

The methodology for identifying the deformity or unstable contact is as follows. In normal conditions, the contact resistance of each probe pin is low when the probe pin contacts the sample wafer. If the contact resistance of probe pin 1 is high, probe pin 1 is deformed because probe pin 1 does not contact the sample wafer and is in an "open" state. If the contact resistance of probe pin 2 is slightly higher than other probe pins or is unstable, some materials such as oxide, photoresist residues or solvent contamination are adhered thereon. As a result, the deformity or unstable contact of each probe pin is identified by checking the contact resistance thereof.

The short, the deformity and the unstable contact are identified respectively by the two embodiments described above. However, the two processes described above can be integrated into a single process; thus, the problems can be identified in one process.

Figure 4:
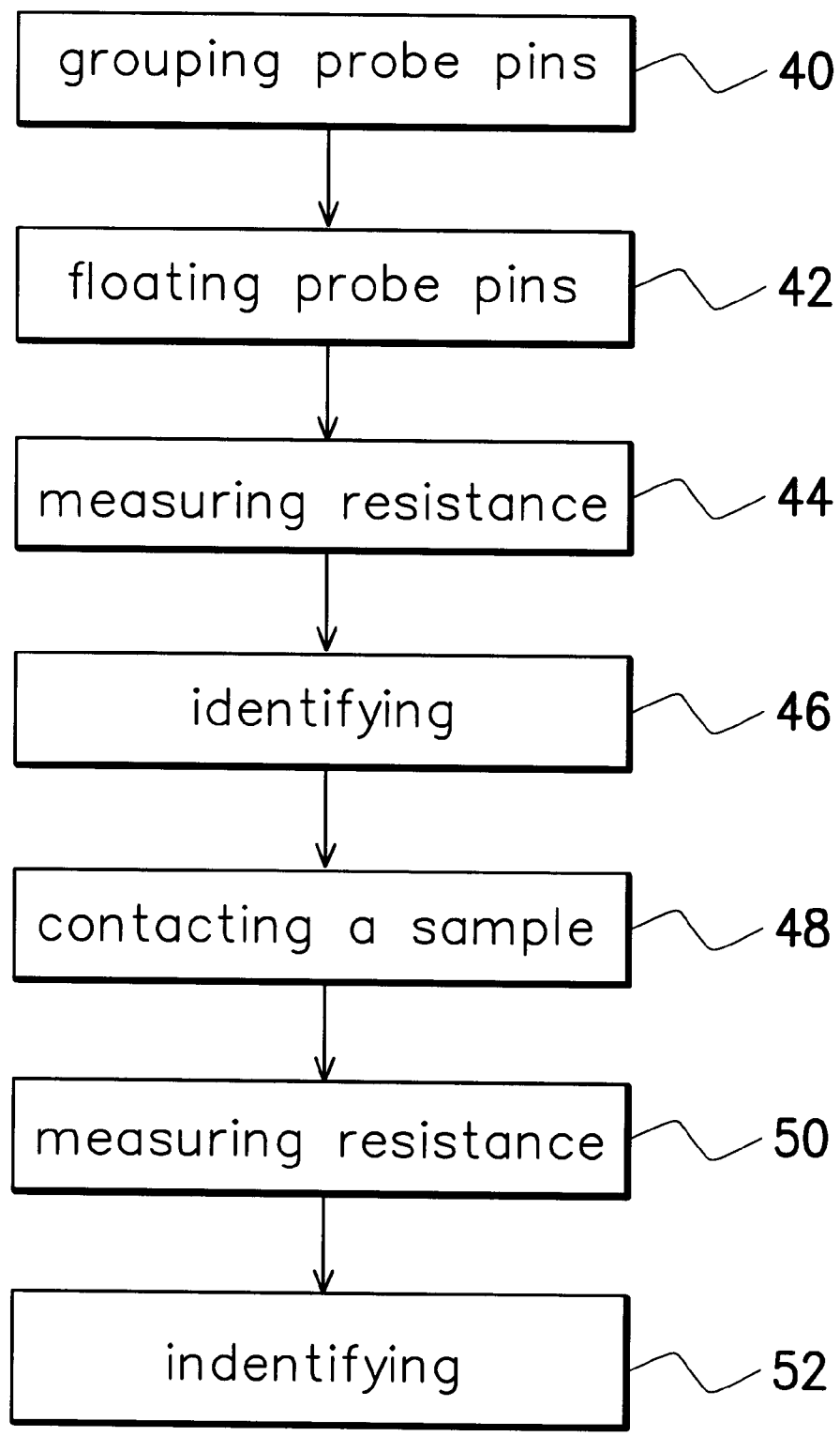
FIG. 4 is a flow diagram showing a methodology for identifying a short, deformity, and unstable contact of the probe pins according to another preferred embodiment of this invention.

FIG. 4 is a flow diagram showing a methodology for identifying a short, a deformity, and an unstable contact of the probe pins according to another preferred embodiment of this invention.

Referring to FIG. 4, probe pins are grouped (step 40). The group setup is the same as that for explaining FIG. 2 and FIG. 3. The group setup is, however, in accordance with the real case and is not limited by the embodiment.

The probe pins are first floated (step 42). In the group of probe pins 1–4, for example, the probe pin 1 is charged to measure the resistance thereof, and probe pins 2–4 are grounded. Then, the resistance of another probe pin is obtained by performing the same process in sequence (step 44). According to the resistance of each probe pin, the short is identified (step 46).

Next, a sample wafer with a thin film thereon is prepared. The thin film is preferably a low resistance thin film such as an aluminum film or a copper film. The probe pins then directly contact the sample wafer (step 48), and the probe pins are charged to measure the contact resistance of each probe pin (step 50). By the contact resistance of each probe pin, the deformity or unstable contact of a probe pin is identified (step 52).

In the present invention, a monitor method for testing probe pins is provided. With the present invention, a plurality of probe pins is grouped and tested simultaneously. Then, the particular probe pin suffering a short, deformity or unstable contact is identified.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. A monitor method for testing probe pins, which is applied on a testing apparatus with a plurality of probe pins, comprising the following steps:

grouping the probe pins, wherein one group includes several probe pins;

floating the probe pins;

measuring resistance of each probe pin, wherein when a probe pin in a group is charged to measure a resistance thereof, other probe pins in the group are grounded;

checking the resistance of each probe pin in the group;

preparing a sample wafer with a thin film;

contacting the probe pins to the sample wafer;

charging the probe pins to measure contact resistance of each probe pin; and checking the contact resistance of each probe pin.

2. The method of claim 1, wherein a material of the thin film is a low resistance material.

3. The method of claim 1, wherein the thin film is made from aluminum.

4. The method of claim 1, wherein the thin film is made from copper.

5. A monitor method for monitoring probe pins, which is for identifying a short between probe pins, comprising the following steps:

grouping the probe pins, wherein several probe pins are grouped in a group; and charging the probe pins to measure resistance of each probe pin, wherein as a probe pin in a group is charged, other probe pins in the group are grounded.

6. The method of claim 5, wherein the probe pins are floated before charging the probe pins.

7. The method of claim 5, wherein as a probe pin in the group is charged, other probe pins in the group are grounded.

8. A monitor method for monitoring probe pins, which is for identifying a deformed or unstable probe pin, comprising the following steps:
- grouping the probe pins, wherein a plurality of probe pins is grouped in a group;
- preparing a sample wafer;
- contacting the probe pins to the sample wafer; and
- charging the probe pins to measure contact resistance of each probe pin.

9. The method of claim 8, wherein a thin film is coated on the sample wafer.

10. The method of claim 9, wherein a material of the thin film is a low resistance material.

11. The method of claim 9, wherein the thin film is made from aluminum.

12. The method of claim 9, wherein the thin film is made from copper.

* * * * *